(12) United States Patent
Zhang et al.

(10) Patent No.: US 12,218,146 B2
(45) Date of Patent: Feb. 4, 2025

(54) ARRAY SUBSTRATE, DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Tiaomei Zhang, Beijing (CN); Yufei Huo, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 986 days.

(21) Appl. No.: 17/280,446

(22) PCT Filed: Jul. 8, 2020

(86) PCT No.: PCT/CN2020/100851
§ 371 (c)(1),
(2) Date: Mar. 26, 2021

(87) PCT Pub. No.: WO2021/008417
PCT Pub. Date: Jan. 21, 2021

(65) Prior Publication Data
US 2021/0384225 A1    Dec. 9, 2021

(30) Foreign Application Priority Data
Jul. 18, 2019  (CN) .......................... 201910649960.3

(51) Int. Cl.
*H01L 27/12* (2006.01)
*G09G 3/00* (2006.01)
(Continued)

(52) U.S. Cl.
CPC .......... *H01L 27/124* (2013.01); *G09G 3/006* (2013.01); *H01L 23/562* (2013.01);
(Continued)

(58) Field of Classification Search
CPC ... H01L 23/562; H01L 23/564; H01L 27/124; H01L 27/1244; H10K 59/60; H10K 59/65
See application file for complete search history.

(56) References Cited

U.S. PATENT DOCUMENTS 9,740,071 B2   8/2017  Anno et al.
9,983,452 B2   5/2018  Jia et al.
(Continued)

FOREIGN PATENT DOCUMENTS

CN    102269886 A   12/2011
CN    102338943 A    2/2012
(Continued)

OTHER PUBLICATIONS

Office Action dated Dec. 1, 2020, issued in counterpart CN application No. 201910649960.3, with English translation. (16 pages).
(Continued)

*Primary Examiner* — Victoria K. Hall
(74) *Attorney, Agent, or Firm* — WHDA, LLP

(57) ABSTRACT

An array substrate includes a display area, and the array substrate includes an anti-cracking dam, a metal lead and a first data line, wherein the anti-cracking dam is arranged on a side of the array substrate and located in the display area, and the anti-cracking dam is arranged to surround a through-hole extending through the array substrate; the metal lead is arranged to at least partially surround the anti-cracking dam; the first data line includes a first section and a second section separated from each other by the through-hole; the first section of the first data line is connected to the first end of
(Continued)

the metal lead, and the second section of the first data line is connected to the another end of the metal lead.

19 Claims, 3 Drawing Sheets

(51) Int. Cl.
  *H01L 23/00*      (2006.01)
  *H01L 21/66*      (2006.01)
(52) U.S. Cl.
  CPC ........ *H01L 23/564* (2013.01); *H01L 27/1244* (2013.01); *G09G 2330/12* (2013.01); *H01L 22/30* (2013.01); *H01L 27/1218* (2013.01)

(56) References Cited

U.S. PATENT DOCUMENTS

| | | |
|---|---|---|
| 10,944,083 B2 | 3/2021 | Lv et al. |
| 2005/0110019 A1 | 5/2005 | Ryu et al. |
| 2012/0139829 A1 | 6/2012 | Anno et al. |
| 2014/0176844 A1 | 6/2014 | Yanagisawa |
| 2017/0199439 A1 | 7/2017 | Jia et al. |
| 2017/0288004 A1 | 10/2017 | Kim et al. |
| 2019/0157607 A1 | 5/2019 | Kim et al. |
| 2019/0288243 A1 | 9/2019 | Lv et al. |
| 2020/0194714 A1* | 6/2020 | Won ...................... H10K 50/84 |
| 2020/0194721 A1* | 6/2020 | Lee ........................ H10K 59/65 |
| 2020/0258913 A1* | 8/2020 | Park ..................... H10K 59/131 |
| 2020/0273919 A1 | 8/2020 | Ding et al. |

FOREIGN PATENT DOCUMENTS

| | | |
|---|---|---|
| CN | 105393165 A | 3/2016 |
| CN | 106816546 A | 6/2017 |
| CN | 106876428 A | 6/2017 |
| CN | 107275363 A | 10/2017 |
| CN | 108400150 A | 8/2018 |
| CN | 109830502 A | 5/2019 |
| CN | 109901747 A | 6/2019 |
| CN | 208954988 U | 6/2019 |
| CN | 109979366 A | 7/2019 |
| CN | 110264891 A | 9/2019 |
| JP | 2006-236818 A | 9/2006 |
| JP | 2006-245466 A | 9/2006 |
| JP | 2011-192683 A | 9/2011 |
| KR | 10-2008-0039141 A | 5/2008 |

OTHER PUBLICATIONS

Office Action dated Jul. 5, 2021, issued in counterpart CN application No. 201910649960.3, with English translation. (17 pages).
International Search Report dated Oct. 13, 2020, issued in counterpart International application No. PCT/CN2020/100851, with English translation. (7 pages).
Written Opinion dated Oct. 13, 2020, issued in counterpart International application No. PCT/CN2020/100851. (4 pages).

* cited by examiner

ARRAY SUBSTRATE, DISPLAY PANEL AND DISPLAY DEVICE

CROSS-REFERENCE TO RELATED APPLICATION

This application is a Section 371 National Stage Application of International Application No. PCT/CN2020/100851, filed on Jul. 8, 2020, entitled "ARRAY SUBSTRATE, DISPLAY PANEL AND DISPLAY DEVICE," which claims priority to Chinese Application No. 201910649960.3, filed on Jul. 18, 2019, which is incorporated herein by reference in their entirety.

TECHNICAL FIELD

The present disclosure relates to the field of display technology, and particularly relates to an array substrate, a display panel and a display device.

BACKGROUND

On-screen aperture technology may effectively increase the screen ratio of the display device and improve user experience. However, micro cracks are very prone to appear on an edge of the aperture, resulting in poor display and reduced life of the display device. There is a lack of solutions in related technologies for effectively detecting cracks on the edge of the aperture of the screen to control the quality of the screen.

The above-mentioned information disclosed in the background section is only used to enhance the understanding of the background of the present disclosure, and therefore it may comprise information that does not constitute related technologies known to those skilled in the art.

SUMMARY

In order to at least partially overcome defects and/or deficiencies in the above-mentioned related technologies, embodiments of the present disclosure provide an array substrate, a display panel, and a display device.

The embodiments of the present disclosure adopt the following technical solutions.

According to a first aspect of the disclosure, an array substrate is provided, the array substrate includes a display area, and the array substrate includes: an anti-cracking dam arranged on a side of the array substrate and located in the display area, wherein the anti-cracking dam is arranged to surround a through-hole extending through the array substrate; a metal lead arranged to at least partially surround the anti-cracking dam; a first data line, including a first section and a second section separated from each other by the through-hole; wherein the first section of the first data line is connected to a first end of the metal lead, and a second section of the first data line is connected to the second end of the metal lead.

In an exemplary embodiment of the present disclosure, the array substrate further includes: an isolation wall arranged to at least partially surround the anti-cracking dam, wherein the isolation wall is configured to block moisture and oxygen from entering a portion of the display area on an outer side of the isolation wall away from the through-hole through the through-hole; the metal lead is arranged between the isolation wall and the anti-cracking dam.

In an exemplary embodiment of the present disclosure, the metal lead is arranged such that a spacing between the mead lead and the through-hole is smaller than a spacing between the mead lead and the anti-cracking dam.

In an exemplary embodiment of the present disclosure, the isolation wall is provided with a first notch and a second notch, the first section of the first data line is connected to the metal lead through the first notch, and the second section of the first data line is connected to the metal lead through the second notch.

In an exemplary embodiment of the present disclosure, the first data line crosses the isolation wall at a layer different from a layer where the isolation wall is located by the means of bridge connection or overlapped connection.

In an exemplary embodiment of the present disclosure, the first data line extends through the isolation wall at the same layer as the isolation wall so that the isolation wall is kept continuous.

In an exemplary embodiment of the present disclosure, the isolation wall is formed with a lateral hole for the first data line to extend through, and an outer surface of the first data line closely abuts an inner wall of the lateral hole to establish a sealed connection between the first data line and the isolation wall, and a surface of the isolation wall except for the lateral hole is continuous.

In an exemplary embodiment of the present disclosure, the array substrate further includes a second data line, and the second data line includes a first section, a second section, and a third section that are sequentially connected; wherein the first section of the second data line is arranged in parallel with the first section of the first data line, and the third section of the second data line is arranged in parallel with the second section of the first data line; the second section of the second data line is curvedly arranged on a side of the isolation wall away from the through-hole.

In an exemplary embodiment of the present disclosure, the second section of the second data line is separated from the isolation wall from the outside at a uniform spacing.

In an exemplary embodiment of the present disclosure, the through-hole is a circular hole, the isolation wall is correspondingly in the form of a ring or a partial ring, and the second section of the second data line is in the form of a circular arc is concentric with the through-hole.

In an exemplary embodiment of the present disclosure, the isolation wall is in the form of a circular ring or a partial circular ring arranged concentrically with the through-hole, and the second section of the second data line is arranged concentrically with both the through-hole and the isolation wall.

In an exemplary embodiment of the present disclosure, the metal lead includes a first metal lead and a second metal lead that are insulated from each other; the number of the first data line is two; wherein the first section and the second section of one of the first data lines are respectively connected to two ends of the first metal lead; the first section and the second section of the other one of the first data lines are respectively connected to two ends of the second metal lead.

In an exemplary embodiment of the present disclosure, the first metal lead and the second metal lead are respectively located on opposite sides of the through-hole, the first metal lead and the second metal lead are both arc-shaped leads that are arranged to be bent in directions away from the through-hole, respectively.

In an exemplary embodiment of the present disclosure, the first metal lead and the second metal lead are arc-shaped leads that are arranged oppositely in a diameter direction and protrude outward.

In an exemplary embodiment of the present disclosure, the metal lead surrounds the anti-cracking dam for at least one loop.

In an exemplary embodiment of the present disclosure, the array substrate further includes: a power line; a detection transistor, wherein a first terminal of the detection transistor is electrically connected to the power line, a control terminal and a second terminal of the detection transistor are connected to the first section of the first data line, and the second section of the first data line is connected to a source driver; the detection transistor is configured to be turned off under the control of a data signal loaded onto the control terminal of the detection transistor, and be turned on after the metal lead is broken to load a voltage on the power line onto the first section of the first data line.

According to a second aspect of the present disclosure, a display panel including the above-mentioned array substrate is provided.

According to a third aspect of the present disclosure, a display device including the above-mentioned display panel is provided.

BRIEF DESCRIPTION OF THE DRAWINGS

In order to clearly illustrate the technical solutions of the embodiments of the present disclosure, the following is a brief description of the drawings in the embodiments of the present disclosure, obviously, the drawings described below are only some embodiments of the present disclosure, for those skilled in the art, other drawings may be obtained based on these drawings without creative work. The above and/or additional aspects and advantages of the present disclosure will become obvious and easy to understand from the following description of the embodiments in conjunction with the drawings, wherein.

DETAILED DESCRIPTION OF EMBODIMENTS

Figure 1:
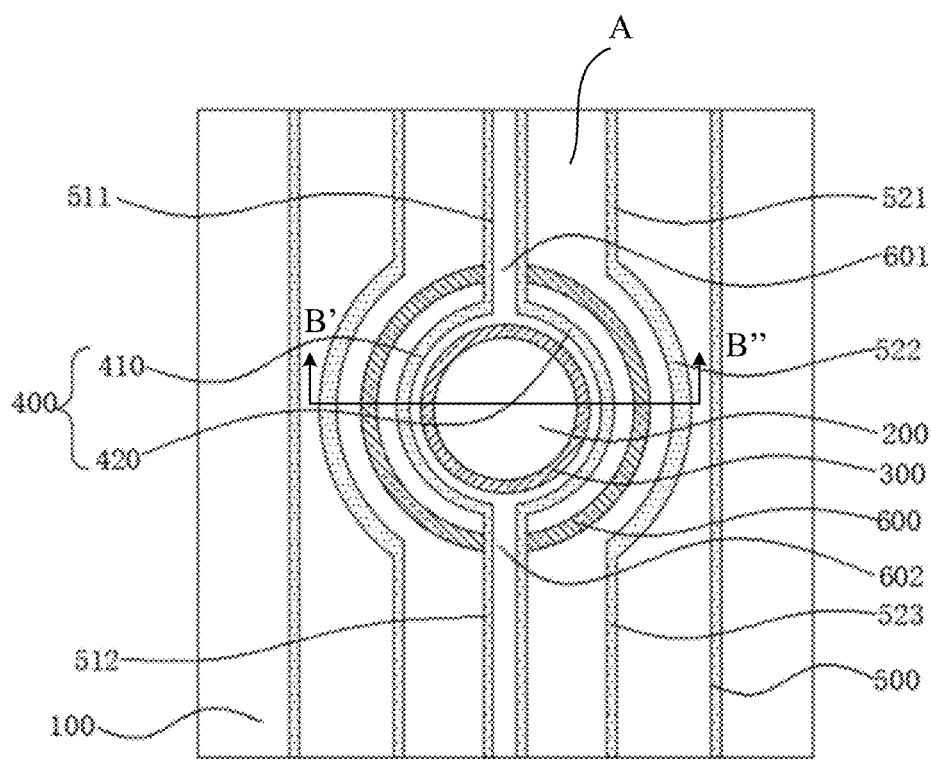
FIG. 1 is a schematic diagram of a structure of an array substrate according to some embodiments of the present disclosure.

In order to clearly illustrate the objectives, technical solutions, and advantages of the embodiments of the present disclosure, the exemplary embodiments will be fully described with reference to the drawings. However, the example embodiments may be implemented in various forms and should not be understood as limited to the examples described herein; on the contrary, these embodiments make the present disclosure more comprehensive and complete, the concept of the exemplary embodiments is fully conveyed to those skilled in the art, and based on the embodiments of the present disclosure, all other embodiments obtained by those skill in the art without creative work belong to the protection scope of the embodiments of the present disclosure. The described features, structures or characteristics may be combined in one or more embodiments in any suitable manner. In the following description, many specific details are provided to give a sufficient understanding of the embodiments of the present disclosure.

In the figures, the thickness of regions and layers may be exaggerated for clarity. The same reference numerals in the figures indicate the same or similar structures, and thus their detailed descriptions will be omitted. The size and shape of the components in the drawings do not reflect the true proportions of the components of the array substrate, the display panel, and the display device of the embodiments of the present disclosure, and the purpose is only to illustrate the content of the embodiments of the present disclosure. In addition, some well-known parts may not be shown in the figure.

In the following, many specific details of the embodiments of the present disclosure, such as the structures, materials, size, handling processes and technology of the components, are described for a clear understanding of the embodiments of the present disclosure. However, as those skilled in the art may understand, the embodiments of the present disclosure may not be implemented according to these specific details.

When a structure is "on" other structures, it may mean that a structure is integrally formed on other structures, or it means that a structure is "directly" arranged on other structures, or it means that a structure is "indirectly" arranged on other structures through another structure.

The terms "a", "an" and "the" indicate that there are one or more elements/components/etc; the terms "comprising" and "having" indicate the open-ended meaning, and mean that there are other elements/components/etc. in addition to the listed elements/components/etc. The terms "first" and "second" are only used as markers, and are not limited to the number of objects.

According to the general technical concept of the embodiments of the present disclosure, in the first aspect of the embodiments of the present disclosure, an array substrate is provided, as shown in FIGS. 1, 2, 3, and 5, the array substrate includes a display area A, and the array substrate also specifically includes an anti-cracking dam 300, a metal lead 400 and a first data line. The anti-cracking dam 300 is arranged on a side of a back plate 100 of the array substrate and located in the display area A, and the anti-cracking dam is arranged to surround a through-hole 200 extending through the array substrate, therefore the anti-cracking dam 300 is configured to suppress cracks at an edge of the through-hole 200 and to prevent the cracks from extending in a direction away from the through-hole 200. The metal lead 400 is arranged to at least partially surround the anti-cracking dam 300, for example, the metal lead includes at least two lead sections (such as a first lead section 410, a second lead section 420) that are arranged to at least partially surround the anti-cracking dam 300 and electrically insulated from each other. The first data line includes a first section 511 and a second section 512 separated from each other by the through-hole 200. The first section 511 of the first data line is connected to a first end of a lead section (e.g., a first lead section 410) of the metal lead 400, a second section 512 of the first data line is connected to a second end of the metal lead 400, the second end is different from the first end, and even the second end is opposite to the first end.

The array substrate according to the embodiments of the present disclosure is provided with the through-hole 200. If there is a crack around the through-hole 200, the metal lead 400 arranged around the through-hole 200 will break, which will cause the first section 511 of the first data line and the second section 512 of the first data line to fail to be electrically connected to each other through the metal lead 400 between the first section and second section of the first data line, so that the data signal fails to be effectively loaded onto the first section 511 of the first data line or the second section 512 of the first data line. In this way, a sub-pixel connected to the first section 511 of the first data line or the sub-pixels connected to the second section 512 of the first data line fails to receive the data signal, which results in abnormal display of the sub-pixel, and indicates that there is a crack around the through-hole 200. In this way, it may be judged whether there is a crack around the through-hole 200 by observing whether the sub-pixel connected to the first data line displays abnormally. In this way, the detection effect is intuitive and clear, a real-time detection on the crack around through-hole 200 during display may be implemented, and even if the array substrate is assembled as a part of a display panel or a display device, it may be still detected whether there is a crack around the through-hole 200 in real time during display. In this way, the array substrate may effectively detect the crack at the edge of the through-hole 200 and improve the quality control level of the screen.

The components of the array substrate provided by the embodiments of the present disclosure will be described in detail below with reference to the drawings.

For example, the array substrate is provided with a plurality of data lines 500 to provide data signals to respective sub-pixels. For example, an end of the data line 500 is connected to a source driver of the display device, so as to receive the data signal provided by the source driver. For example, the data line 500 is connected to a plurality of sub-pixels, so as to load the data signals thereon onto respective sub-pixels one by one. For example, the respective sub-pixels are configured to independently emit light according to the data signals which are loaded thereon respectively.

The first data line is at least one of the data lines 500 on the array substrate. It can be understood that when the metal lead 400 is not broken, the first section 511 of the first data line and the second section 512 of the first data line are electrically connected to each other, and the data signal loaded on the first data line may be loaded onto the first section 511 of the data line and the second section 512 of the first data line at the same time. Therefore, the respective sub-pixels connected to the first section 511 of the first data line and the second section 512 of the first data line may be loaded with the data signals, respectively, so that these sub-pixels may display normally.

When the metal lead 400 is broken, the first section 511 of the first data line and the second section 512 of the first data line fail to be electrically connected to each other, therefore the data signal may only be loaded onto one section of the first data line that is connected to the source driver. As a result, the other section of the first data line fails to be loaded with the data signal, so that the sub-pixel connected to the other section displays abnormally. For example, an end of the second section 512 of the first data line away from the first section 511 of the first data line is connected to a bonding pad, and the bonding pad is connected to the source driver. In this way, in the normal operation condition where the metal lead 400 is not broken, the data signal provided by the source driver may be firstly loaded onto the second section 512 of the first data line, and then the data signal is loaded onto the first section 511 of the first data line through the metal lead 400. When the metal lead 400 is broken, the data signal fails to be loaded onto the first section 511 of the first data line, the sub-pixel connected to the first section 511 of the first data line displays abnormally, and only the sub-pixel connected to the second section 512 of the first data line displays normally.

In the embodiments of the present disclosure, the sub-pixel includes, for example, a light-emitting element and a driving circuit for driving the light-emitting element to emit light. For example, abnormal display of the sub-pixel refers to abnormal light emission of the light-emitting element, especially refers to that the light-emitting element does not emit light when it should emit light or emits light when it should not emit light. The data signal is loaded onto the sub-pixel, for example, refers to that the data signal is loaded onto the driving circuit and the driving circuit then drives the light-emitting element to emit light according to the loaded data signal.

It can be understood that when the data signal fails to be loaded onto the sub-pixel, the light-emitting element may emit light or not emit light under the driving of the driving circuit and display abnormally. That is, when the data signal fails to be loaded onto the sub-pixel, the light-emitting element may emit light under the driving of some driving circuits; and the light-emitting element may not emit light under the driving of other driving circuits. Regardless of whether the light-emitting element emits light or does not emit light, the abnormal display of the sub-pixel may be obviously observed, so that it may certainly judge whether there is a crack around the through-hole 200.

In some embodiments of the present disclosure, the driving circuit includes, for example, a driving transistor, a capacitor, a data writing transistor, and a reset transistor, wherein the driving transistor, the data writing transistor, and the reset transistor each have a first terminal, a second terminal and a control terminal. As an example, in an exemplary specific arrangement, the first terminal of the driving transistor is connected to a first power supply, and more specifically, the first terminal is connected to the high-level power supply VDD; the second terminal of the driving transistor is, for example, connected to an input terminal of the light-emitting element. An output terminal is, for example, connected to a second voltage, and more specifically, the output terminal is connected to the low-level power supply VSS. The control terminal of the driving transistor is, for example, connected to the capacitor, the first terminal of the data writing transistor, and the first terminal of the reset transistor; the second terminal of the data writing transistor is, for example, configured to load a data signal. The second terminal of the reset transistor is, for example, configured to load a reset signal, and the reset signal is preset to a value that turns on the driving transistor. In this way, when the data signal fails to be loaded onto the second terminal of the data writing transistor, the control terminal of the driving transistor is always loaded with the reset signal so that the driving transistor is kept in on-state constantly. In this case, the sub-pixel displays abnormally, which may be manifested in that no matter what data signal is loaded onto the sub-pixel, the sub-pixel presents a light-emitting state during the light-emitting stage, for example, when the array substrate originally displays a black image, the sub-pixel actually emits light.

In other embodiments of the present disclosure, the driving circuit includes, for example, a driving transistor, a capacitor, a data writing transistor, and a reset transistor, wherein the driving transistor, the data writing transistor, and the reset transistor each have a first terminal, a second terminal and a control terminal. As an example, in an exemplary specific arrangement, the first terminal of the driving transistor is, for example, connected to a first power supply, and more specifically, the first terminal of the driving transistor is connected to the high-level power supply; the second terminal of the driving transistor is, for example, connected to an input terminal of the light-emitting element; an output terminal of light-emitting element is, for example, connected to the second voltage, and more specifically, the output terminal of light-emitting element is connected to the low-level power supply. The control terminal of the driving transistor is, for example, connected to the capacitor, the first terminal of the data writing transistor, and the first terminal of the reset transistor; the second terminal of the data writing transistor is, for example, configured to load a data signal. The second terminal of the reset transistor is, for example, configured to load a reset signal, and the reset signal is preset to a value that turns off the driving transistor. In this way, when the data signal fails to be loaded onto the second terminal of the data writing transistor, the control terminal of the drive transistor is always loaded with the reset signal, so that the drive transistor is kept in an off-state constantly. In this case, the sub-pixel displays abnormally, which may be manifested in that no matter what data signal is loaded onto the sub-pixel, the sub-pixel does not emit light during the light-emitting stage, for example, when the array substrate originally displays a white image, the sub-pixel actually does not emit light.

Figure 2:
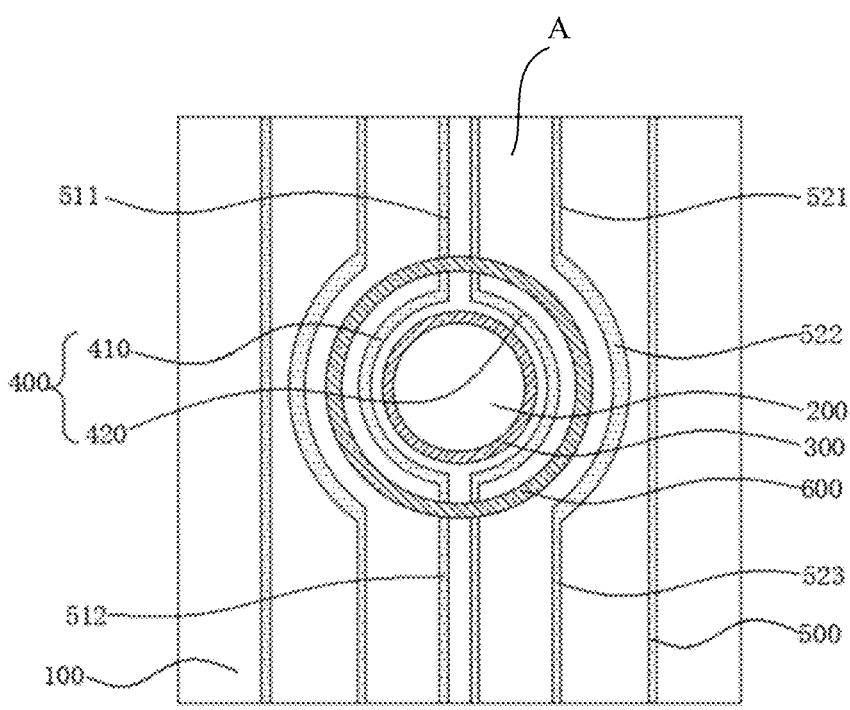
FIG. 2 is a schematic diagram of a structure of an array substrate according to some embodiments of the present disclosure.
Figure 3:
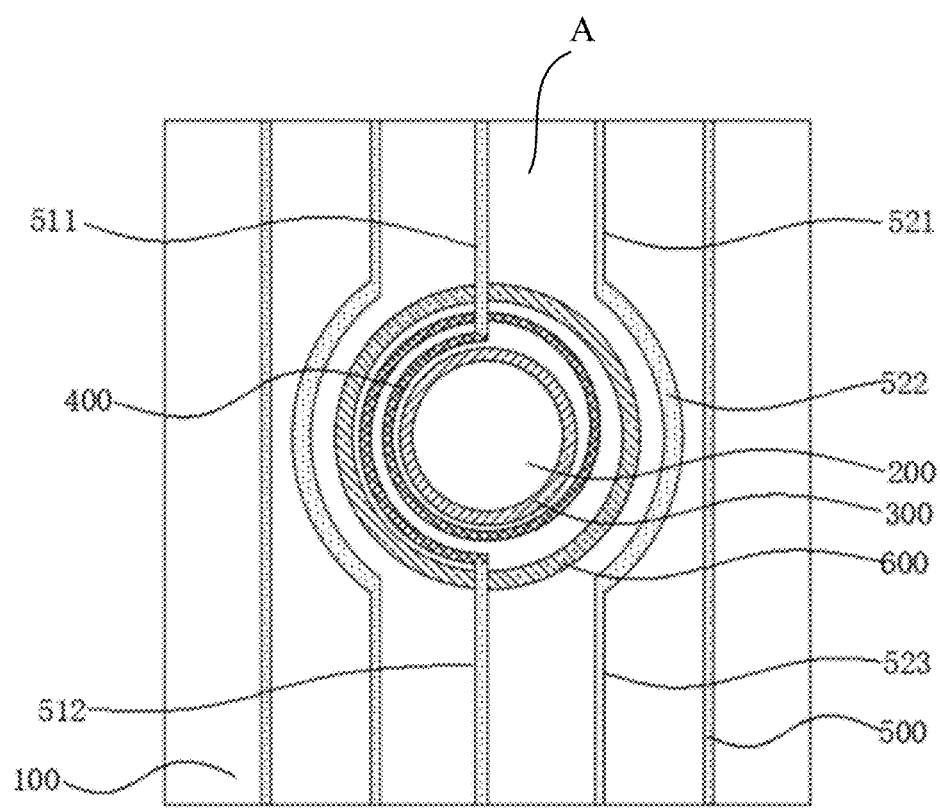
FIG. 3 is a schematic diagram of a structure of an array substrate according to some embodiments of the present disclosure.

As shown in FIGS. 1, 2 and 3, the array substrate according to the embodiments of the present disclosure further includes, for example, an isolation wall 600, the isolation wall 600 is arranged to at least partially surround the anti-cracking dam 300, and the isolation wall 600 is thus configured to block moisture and oxygen from entering the array substrate (especially a part of the display area A of the array substrate located outside the isolation wall 600) through the periphery of the through-hole 200, and the isolation wall may protect the sub-pixels of the array substrate from the influence of moisture and oxygen. The metal lead 400 is, for example, arranged between the isolation wall 600 and the anti-cracking dam 300, and more specifically, the metal lead 400 is arranged as close to the through-hole 200 as possible (that is, a spacing between the metal lead and the anti-cracking dam 300 is smaller than a spacing between the metal lead and the isolation wall 600, therefore, a comparison between an actual display state of the sub-pixels connected to the metal lead 400 and an expected display state under normal connection conditions (that is, when there is no crack around the through-hole 200) may represent the crack around the through-hole 200 in time, and the comparison of display states is more sensitive to small cracks around the through-hole 200.

In some embodiments of the present disclosure, as shown in FIG. 1, for example, the isolation wall 600 is provided with a first notch 601 and a second notch 602. The first section 511 of the first data line is connected to the metal lead 400 through the first notch 601 (e.g. the upper end of the first lead section 410 or the upper end of the second lead section 420 of the metal lead 400 shown in the drawings); the second section 512 of the first data line is connected to the metal lead 400 (e.g. the lower end of the first lead section 410 or the lower end of the second lead section 420 of the metal lead 400 shown in the drawings) through the second notch 602. In this way, for example, the first data line may cross the isolation wall 600 without providing any bridge connection, overlapped connection, or other transitional connections, thereby simplifying the structure and the manufacturing process of the array substrate.

In other embodiments of the present disclosure, as shown in FIG. 2 and FIG. 3, for example, the first data line crosses the isolation wall 600 by means of bridge connection, overlapped connection, or other transitional connections at a layer different from the layer where the isolation wall is located. Optionally, the first data line extends through the isolation wall 600 in the same layer as the isolation wall, and the isolation wall 600 is kept continuous (in this case for example the isolation wall is formed with a lateral hole for the first data line to extend through, an outer surface of first data line is closely abuts an inner wall of lateral hole, for example a sealed connection is formed between the first data line and the isolation wall, and the surface of the isolation wall except for the lateral holes is continuous). In this way, the integrity of the isolation wall 600 will not be broken, the effect of blocking water vapor will not be reduced, and the life and performance of the array substrate could be ensured.

In the exemplary embodiments of the present disclosure, for example, as shown in FIGS. 1, 2 and 3, the data line 500 of the array substrate further includes, for example, a second data line, the second data line includes a first section 521, a second section 522, and a third section 523 that are sequentially connected. The first section 521 of the second data line is parallel with the first section 511 of the first data line, and the third section 523 of the second data line is parallel with the second section 512 of the first data line; the second section 522 of the second data line is curvedly arranged on a side of the isolation wall 600 away from the through-hole 200 (more specifically, for example, separated from the isolation wall 600 from the outside at a uniform spacing). In this way, the second data line is arranged to bypass the through-hole 200 from the outside of the isolation wall 600 so that the second data line is far away from the through-hole 200, reducing the risk of the second data line being damaged by cracks and water vapor from the direction of the through-hole 200.

In some embodiments of the present disclosure, as shown in FIGS. 1, 2 and 3, the through-hole 200 is, for example, in the form of a circle, the isolation wall 600 is correspondingly, for example, in the form of a ring or a partial ring (more specifically, for example, concentrically arranged with the through-hole 200), the second section 522 of the second data line is correspondingly in the form of a circular arc (a partial ring section), and the second section 522 of the second data line is concentric with the through-hole 200 (for example, the through-hole 200 is concentric with the isolation wall 600).

In some embodiments of the present disclosure, as shown in FIGS. 1 and 2, the number of the first data lines is, for example, two; the metal lead 400 includes, for example, two lead sections insulated from each other, for example, the two lead sections are the first metal lead 410 and a second metal lead 420, respectively. The first section 511 and the second section 512 of the first data line are respectively connected to two ends of the first metal lead 410. The first section 511 and the second section 512 of another first data line are respectively connected to two ends of the second metal lead 420. In this way, the first metal lead 410 and the second metal lead 420 (more specifically, the display conditions of the sub-pixels connected to the first metal lead 410 and the second metal lead 420) are used to detect cracks at different positions, respectively.

In exemplary embodiments of the present disclosure, for example, as shown in FIGS. 1 and 2, the first metal lead 410 and the second metal lead 420 are arc-shaped leads whose middle sections are opposite (for example, arranged oppositely in a diameter direction and protrude outward).

In some embodiments of the present disclosure, as shown in FIG. 3, the metal lead 400 is, for example, arranged to surround the anti-cracking dam 300 for at least one loop to ensure that the metal lead 400 may detect cracks in any direction around the through-hole 200. For example, the metal lead 400 is arranged to surround the anti-crack dam 300 for one and a half loop.

Figure 4:
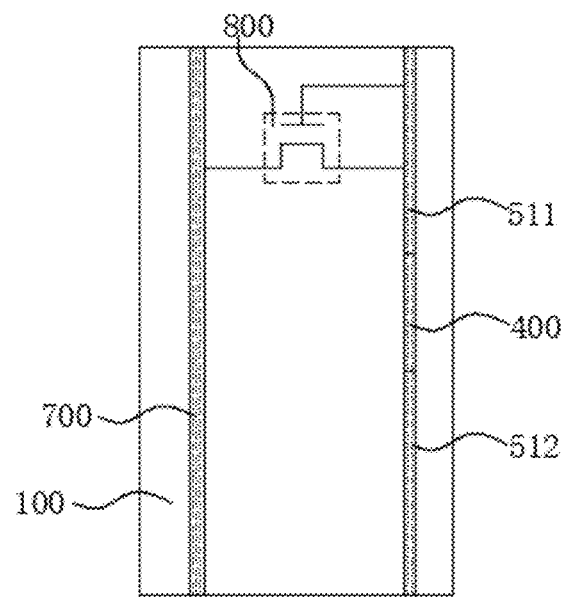
FIG. 4 is a schematic diagram of an arrangement of a detection transistor according to some embodiments of the present disclosure.
Figure 5:
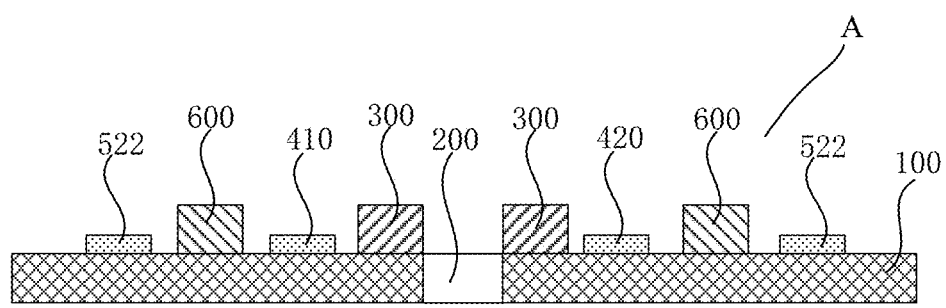
FIG. 5 is a sectional view of the array substrate according to some embodiments of the present disclosure taken along a cutting line B'B'' shown in FIG. 1.

In some embodiments of the present disclosure, as shown in FIG. 4, the array substrate further includes, for example, a power line 700 and a detection transistor 800, wherein the first terminal (i.e., the power line terminal) of the detection transistor 800 and the power line 700 is are electrically connected, the control terminal and the second terminal of the detection transistor 800 are connected to the first section 511 of the first data line, and the second section 512 of the first data line is used to connect to a source driver. The detection transistor 800 is selected to be the same type as the driving transistor of the driving circuit. When the data signal is directly loaded onto the detection transistor 800 and the driving transistor, the detection transistor 800 and the driving transistor are turned off.

In this way, when the metal lead 400 does not break, the detection transistor 800 is turned off, and the data signal may be normally loaded onto the first section 511 of the first data line and the second section 512 of the first data line, so that the sub-pixel connected to the first data line displays normally. When the metal lead 400 is broken, the data signal may only be loaded onto the second section 512 of the first data line, and only the sub-pixel connected to the second section 512 of the first data line displays normally; and at the same time, the data signal fails to be loaded onto the first section 511 of the first data line, therefore the detection transistor 800 is turned on under the driving of the voltage on the power line 700, so that the voltage on the power line 700 replaces the data signal and the voltage on the power line 700 is loaded onto the sub-pixels, so that the sub-pixels display abnormally.

In exemplary embodiments of the present disclosure, the power line 700 is, for example, connected to a high-level power supply VDD so that the voltage loaded on the power line is a high-level voltage. In exemplary embodiments of the present disclosure, for example, when the metal lead 400 is broken, the sub-pixel connected to the first section 511 of the first data line does not emit light.

The embodiments of the present disclosure further provide a display panel, and the display panel includes any of the array substrates described in the above-mentioned embodiments. The display panel is, for example, an OLED (organic light emitting diode) display panel, an LCD (liquid crystal display panel) or other types of display panels. Since the display panel has any of the array substrates described in the above-mentioned array substrate embodiments, it has the same beneficial effects, which will not be repeated in this disclosure.

The embodiments of the present disclosure also provide a display device, and the display device includes any of the display panels described in the above embodiments. The display device is, for example, a mobile phone screen with on-screen aperture, a notebook screen with on-screen aperture, or other types of display devices. Since the display device has any one of the display panels described in the above-mentioned display panel embodiments, it has the same beneficial effects, which will not be repeated in this disclosure.

Compared with related technologies, based on the above technical solutions, the array substrate, display panel, and display device provided by the embodiments of the present disclosure have at least the following superior technical effects.

The embodiments of the present disclosure provide the array substrate, the display panel, and the display device, if there are cracks around the through-holes, the metal leads will break, thereby causing the first section of the first data line and the second section of the first data line to be unable to be electrically connected, so that the data signal fails to be effectively loaded onto the first section of the first data line or the second section of the first data line. In this way, the sub-pixels connected to the first section of the first data line or the second section of the first data line fail to receive data signals, which results in abnormal display of these sub-pixels, and indicates that there is a crack around the through-hole. In this way, it may be judged whether there is a crack around the through-hole by observing whether the sub-pixels connected to the first data line display abnormally. This not only has an intuitive and clear detection, but also implements real-time detection of cracks around the through-hole during displaying, and even if the array substrate is assembled into a display panel or display device, it may still detect whether cracks exist around the through-hole in real time while displaying. In this way, the array substrate may effectively detect cracks at the edge of the through-hole and improve the quality control level of the aperture screen.

It should be understood that the present disclosure does not limit its application to the detailed structure and arrangement of components proposed in the specification. The present disclosure has other embodiments, and the embodiments may be implemented and executed in various ways. The changes and modifications are within the protection scope defined by the claims of the embodiments of the present disclosure and equivalent technologies, and do not depart from the spirit and scope of the embodiments of the present disclosure. It should be understood that the present disclosure disclosed in this specification extends to all alternative combinations of two or more individual features mentioned in the text and/or drawings. All these different combinations constitute multiple alternative aspects of the present disclosure. The embodiments described in this specification illustrate the best way known for implementing the present disclosure, and those skilled in the art may utilize the present disclosure.

What is claimed is:

1. An array substrate, the array substrate comprising a display area, wherein the array substrate comprises:
   an anti-cracking dam arranged on a side of the array substrate and located in the display area, wherein the anti-cracking dam is arranged to surround a through-hole extending through the array substrate;
   a metal lead arranged to at least partially surround the anti-cracking dam;
   a first data line, comprising a first section and a second section separated from each other by the through-hole, wherein the first section of the first data line is connected to a first end of the metal lead, and the second section of the first data line is connected to a second end of the metal lead.

2. The array substrate of claim 1, wherein the array substrate further comprises:
   an isolation wall arranged to at least partially surround the anti-cracking dam,
   wherein the isolation wall is configured to block moisture and oxygen from entering a portion of the display area on an outer side of the isolation wall away from the through-hole through the through-hole, and the metal lead is arranged between the isolation wall and the anti-cracking dam.

3. The array substrate of claim 2, wherein the metal lead is arranged such that a spacing between the metal lead and the anti-cracking dam is smaller than a spacing between the metal lead and the isolation wall.

4. The array substrate of claim 3, wherein the isolation wall is provided with a first notch and a second notch, the first section of the first data line is connected to the metal lead through the first notch, and the second section of the first data line is connected to the metal lead through the second notch.

5. The array substrate of claim 2, wherein the isolation wall is provided with a first notch and a second notch, the first section of the first data line is connected to the metal lead through the first notch, and the second section of the first data line is connected to the metal lead through the second notch.

6. The array substrate of claim 2, wherein the first data line crosses the isolation wall at a layer different from a layer where the isolation wall is located, by means of bridge connection or overlapped connection.

7. The array substrate of claim 2, wherein the first data line extends through the isolation wall at a same layer as the isolation wall so that the isolation wall is kept continuous.

8. The array substrate of claim 7, wherein the isolation wall is formed with a lateral hole for the first data line to extend through, and an outer surface of the first data line closely abuts an inner wall of the lateral hole to establish a sealed connection between the first data line and the isolation wall, and a surface of the isolation wall except for the lateral hole is continuous.

9. The array substrate of claim 2, wherein the array substrate further comprises a second data line, and the second data line comprises a first section, a second section, and a third section that are sequentially connected;
wherein the first section of the second data line is arranged in parallel with the first section of the first data line, and the third section of the second data line is arranged in parallel with the second section of the first data line; the second section of the second data line is curvedly arranged on a side of the isolation wall away from the through-hole.

10. The array substrate of claim 9, wherein the second section of the second data line is separated from the isolation wall from the outside at a uniform spacing.

11. The array substrate of claim 9, wherein the through-hole is a circular hole, the isolation wall is correspondingly in the form of a ring or a partial ring, and the second section of the second data line is in the form of a circular arc that is concentric with the through-hole.

12. The array substrate of claim 11, wherein the isolation wall is in the form of a circular ring or a partial circular ring arranged concentrically with the through-hole, and the second section of the second data line is arranged concentrically with both the through-hole and the isolation wall.

13. The array substrate of claim 1, wherein the metal lead comprises a first metal lead and a second metal lead that are insulated from each other; and the number of the first data line is two; and
the first section and the second section of one of the first data lines are respectively connected to two ends of the first metal lead; the first section and the second section of the other one of the first data lines are respectively connected to two ends of the second metal lead.

14. The array substrate of claim 13, wherein the first metal lead and the second metal lead are respectively located on opposite sides of the through-hole, the first metal lead and the second metal lead are both arc-shaped leads that are arranged to be bent in directions away from the through-hole, respectively.

15. The array substrate of claim 14, wherein the first metal lead and the second metal lead are arc-shaped leads that are arranged oppositely in a diameter direction and protrude outward.

16. The array substrate of claim 1, wherein the metal lead surrounds the anti-cracking dam for at least one loop.

17. The array substrate of claim 1, wherein the array substrate further comprises:
a power line; and
a detection transistor, wherein a first terminal of the detection transistor is electrically connected to the power line, a control terminal and a second terminal of the detection transistor are connected to the first section of the first data line, and the second section of the first data line is connected to a source driver; the detection transistor is configured to be turned off under the control of a data signal loaded onto the control terminal of the detection transistor, and be turned on after the metal lead is broken to load a voltage on the power line onto the first section of the first data line.

18. A display panel, wherein the display panel comprises the array substrate of claim 1.

19. A display device, wherein the display device comprises the display panel of claim 18.

* * * * *